United States Patent [19]

Baba et al.

[11] Patent Number: 5,031,021
[45] Date of Patent: Jul. 9, 1991

[54] SEMICONDUCTOR DEVICE WITH A HIGH BREAKDOWN VOLTAGE

[75] Inventors: Yoshiro Baba; Kazuo Tsuru, both of Yokohama; Tatsuo Akiyama, Tokyo; Yutaka Koshino, Yokosuka, all of Japan

[73] Assignee: Kabushiki Kaisha Toshiba, Kawasaki, Japan

[21] Appl. No.: 905,958

[22] Filed: Sep. 11, 1986

[30] Foreign Application Priority Data

Sep. 30, 1985 [JP] Japan .................... 60-216586

[51] Int. Cl.$^5$ .................... H01L 29/40
[52] U.S. Cl. .................... 357/53; 357/52
[58] Field of Search .................... 357/53, 52

[56] References Cited

U.S. PATENT DOCUMENTS

| | | | |
|---|---|---|---|
| 3,971,061 | 7/1976 | Matsushita et al. | 357/52 |
| 4,063,275 | 12/1977 | Matsushita et al. | 357/54 |
| 4,084,986 | 4/1978 | Aoki et al. | 357/52 |
| 4,344,985 | 8/1982 | Goodman et al. | 357/54 |
| 4,420,765 | 12/1983 | Tarng | 357/54 |

FOREIGN PATENT DOCUMENTS 2047461A 4/1979 United Kingdom .

OTHER PUBLICATIONS

"Semi-Insulating Polycrystalline-Silicon (SIPOS) Films Applied to MOS Integrated Circuits", Proceedings of the 7th Conf. on Solid State Devices, Tokyo 1975, Supplement to Japanese Journal of Applied Physics, vol. 15, 1976, pp. 41–48.
"Highly Reliable High-Voltage Transistors by Use of the SIPOS Process," IEEE Transactions on Electron Devices, vol. ED-23, No. 8, Aug., 1976, pp. 826–830.
Matsushita et al., "Highly Reliable High-Voltage Transistors by Use of the SIPOS Process," IEEE Transactions on Electron Devices, vol. ED-23, No. 8, pp. 826–830, Aug. 1976.
Mimura et al., "High-Voltage Planar Structure Using SiO2-SIPOS-SiO2 Film," IEEE Electron Device Letters, vol. EDL-6, No. 4, pp. 189–191, Apr. 1984.

*Primary Examiner*—Andrew J. James
*Assistant Examiner*—Sara W. Crane
*Attorney, Agent, or Firm*—Finnegan, Henderson, Farabow, Garrett and Dunner

[57] ABSTRACT

There is disclosed a power transistor comprising a semiconductor substrate having a PN junction exposed on a major surface of the semiconductor substrate, and a semiinsulative polysilicon film formed on the major surface, the polysilicon film covering the PN junction, the polysilicon film containing at least one of carbon, oxygen, and nitrogen, and the polysilicon film having a thickness of about 3000 Å.

3 Claims, 4 Drawing Sheets

SEMICONDUCTOR DEVICE WITH A HIGH BREAKDOWN VOLTAGE

BACKGROUND OF THE INVENTION

The present invention relates to a semiconductor device and, more particularly, to an improvement in a passivation structure of a high breakdown voltage element such as a power transistor.

Guard-ring structure and resistive field structure provide a planar transistor with a high breakdown voltage of, for example, 1,000 V or more. In a guard-ring structure, a ring-like diffusion layer is formed around a base diffusion layer. In a resistive field plate structure, a high resistance film is formed between a base electrode and an equi-potential ring (EQPR) collector electrode. A potential difference is applied across both ends of the high resistance film to create a potential gradient from the base region to the equipotential ring collector region.

Takeshi Matsushita et al. described in "Highly Reliable High Voltage Transistors By Use of the SIPOS Process," "IEEE Transactions on Electron Devices," Vol. ED. 23, No. 8, August 1976, a semi-insulative polysilicon (SIPOS) film as a passivation structure of a power transistor. The passivation structure prevents a drop in the breakdown voltage and a decrease in reliability due to an external charge. In the passivation structure, the SIPOS film is formed by direct deposition of semi-insulative polysilicon doped with oxygen onto a substrate surface using a CVD method.

A SIPOS film has the following electrical characteristics:

(1) Shield effect

The SIPOS film is electrically almost neutral, and shows semi-insulating characteristics. As a result, when a charge is applied to a structure comprising a silicon substrate—a SIPOS film—an insulation film, the charge is shielded by the SIPOS film and does not enter the silicon substrate. Therefore, influence on the silicon substrate from external charges is prevented.

(2) Hot carrier release effect

In a SIPOS film, carriers move by hopping between states which are continuous in the energy band gap. This means that when a reverse bias is applied to the pn junction in the substrate, the hot carriers injected in the SIPOS film are released.

(3) Switching effect

The conductivity of a SIPOS film varies with the intensity of the electric field in the film. If the field intensity exceeds 2 or $3 \times 10^5$ V/cm, the conductivity will drop in the order of 100 to 1,000,000 times.

Conventionally, a combination of a guard-ring structure and a SIPOS film is known as a means of obtaining a power transistor with a high breakdown voltage and good reliability. FIG. 1 is a sectional view of a portion of such a structure. In FIG. 1, reference numeral 1 denotes an $n^-$-type semiconductor substrate; 2, a collector region comprising an $n^+$-type diffusion layer formed on the lower surface of substrate 1; 3, a base region comprising a $p^+$-type diffusion layer formed on a portion of the upper surface of substrate 1; 4, an equi-potential ring (EQPR) collector region comprising an $n^+$-type diffusion layer formed on a portion of the upper surface of substrate 1; and 5, a guard ring region comprising a $p^+$-type diffusion layer formed on the portion of the upper surface of substrate 1 to surround base region 3. Three guard-ring regions are usually provided to surround triple base region 3. However, for the sake of clarity, only one region is shown. Reference numeral 6 denotes a SIPOS film deposited on the upper surface of substrate 1; 7, an insulation ($SiO_2$) film formed on film 6 and extending onto base region 3 and EQPR collector region 4; 8, an electrode (normally aluminum) formed on region 3; 9, an electrode (normally aluminum) formed on region 4; and 10, a passivation formed film on electrodes 8 and 9 and film 7.

In order to increase the reliability of a transistor with the resistive field plate, a high resistance SIPOS film is conventionally proposed as the field plate 11, as shown in FIG. 2. In FIG. 2, insulation ($SiO_2$) film 7 is formed on the upper surface of substrate 1, and SIPOS film 11 is formed on film 7. Film 11 connects electrodes 8 and 9. The same reference numerals in FIGS. 1 and 2 denote the same parts. The transistor with this structure, compared with the above-described transistor having triple guard-rings, has a smaller chip area, and is free from an abnormal impurity diffusion from the guard-rings and pinholes between the guard-rings.

In the transistor having the guard-ring structure and SIPOS film shown in FIG. 1, in order to resolve the two problems of shielding against external charges and release of hot carriers injected from the substrate, it is necessary to increase the thickness of film 6 to 1.0 μm or more so that the concentration of doped oxygen is reduced. However, because of variations in impurity diffusion into the guard ring region and in the composition of film 6 which is sensitive to CVD processing conditions, conductivity will drop greatly in film 6, and the leakage current near breakdown voltage level increases to cause the reverse-bias waveform to go soft.

FIG. 3 shows the relationship of collector-base voltage $V_{CB}$ to collector-base reverse current $I_{CB}$. The switching characteristics in film 6 affect breakdown characteristics, which develop a soft waveform as shown in FIG. 4. Transistors having breakdown characteristics shown in FIG. 4 thermally break down in bias (B) - temperature (T) stress tests. As a result, it is difficult to improve reliability and manufacturing yield.

In the transistor shown in FIG. 2, which uses a high resistance film (a SIPOS film) as resistive field 11, because of the potential gradient in plate 11, the electric field on the surface of the substrate is weak, and the injection of hot carriers into film 7 is reduced. However, since film 7 is formed on the upper surface of substrate 1, improvements in reliability coming from the injection release of hot carriers by film 11 cannot be satisfactorily obtained.

SUMMARY OF THE INVENTION

The present invention was made in consideration of the above situation, and has as its object to provide a semiconductor device with a high breakdown voltage, which has a high reliability and a high production yield.

According to the invention, there is provided a semiconductor device with a high breakdown voltage comprising a semiconductor substrate having a PN junction, said PN junction being exposed on a major surface of said semiconductor substrate, and a semiinsulative polysilicon film formed on said major surface, said polysilicon film covering said PN junction, said polysilicon film containing at least one of carbon, oxygen, and nitrogen, and said polysilicon film having a thickness from substantially 100 Å to substantially 4500 Å.

DETAILED DESCRIPTION OF THE PREFERRED EMBODIMENTS

Figure 5:
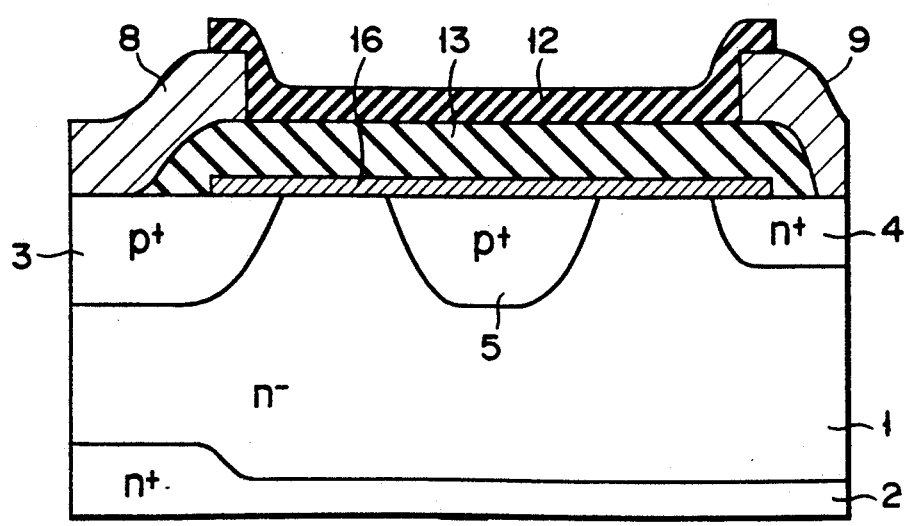
FIG. 5 is a sectional view of a portion of a power transistor according to an embodiment of the present invention, which has a guard-ring structure.

FIG. 5 shows an embodiment of the present invention. In this embodiment, the present invention is applied to a power transistor, and the combination of a guard ring structure and a SIPOS (semi-insulating polysilicon) film is used.

Figure 1:
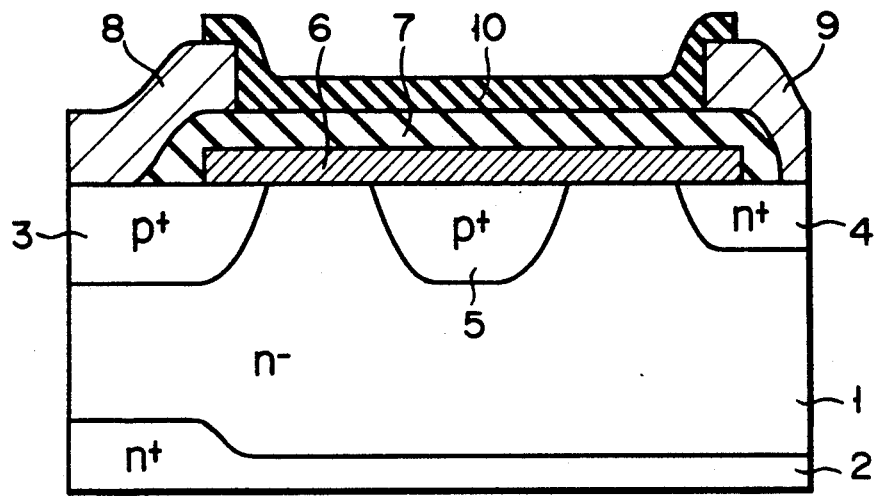
FIG. 1 is a cross-sectional view of a portion of a conventional power transistor.

This embodiment differs from the conventional device shown in FIG. 1 in two ways:

First, the thickness of SIPOS film 16 corresponding to SIPOS film 6 in FIG. 1 is set between about 100 Å and about 4,500 Å. Second, film 10 is replaced by high resistive film 12. Film 12 has a resistivity of about $10^8$ to $10^{12}$ Ω·cm and contacts electrodes 8 and 9. Other portions of the transistors shown in FIGS. 1 and 5 are substantially the same, thus a detailed description thereof will be omitted.

The embodiment shown in FIG. 5 will now be described.

P+-type impurity diffusion region 3 having a high impurity concentration is formed in an upper major surface region of n−-type semiconductor substrate 1. Region 3 constitutes the base region of the power transistor. P+-type impurity diffusion region 4 having a high impurity concentration is formed in the upper major surface region of substrate 1. Region 4 constitutes the equi-potential ring (EQPR) collector region of the power transistor. P+-type impurity diffusion region 5 having a high impurity concentration is also formed in the upper major surface region of substrate 1. Region 5 is a guard-ring region and surrounds base region 3, though this is not clearly shown in FIG. 5. In FIG. 5, only one layer of guard-ring region 5 is shown for the sake of simplicity. In actual use, however, three layers are preferable, in order to surround base region 3 triply and guarantee its protection. In the lower major surface of substrate 1, n+-type impurity diffusion region 2 having a high impurity concentration is formed. Region 2 serves as a collector contact region for providing ohmic contact with a collector electrode (not shown). SIPOS film 16 is formed on the upper major surface of substrate 1. Film 16 extends on the upper surface from region 3 to region 4. The thickness of film 16 is set between about 100 Å and 4,500 Å. Insulation film 13 is formed on SIPOS film 16. Insulation film 13 extends onto base region 3 and EQPR collector region 4. Base electrode 8 and EQPR collector electrode 9 made of, for example, aluminum are formed on regions 3 and 4, respectively. High resistance film 12 having a resistivity of $10^8$ to $10^{12}$ Ω·cm is formed on film 13. Film 12 contacts electrodes 8 and 9 at their respective ends. Electrodes 8 and 9 are therefore electrically connected through film 12.

The steps in the manufacture of the transistor in FIG. 5 will now be described.

Film 16 is formed by, for example, a plasma CVD method. Before this processing, dilute hydrofluoric acid is used to perform HF dip on the major surface of substrate 1, in order to minimize the leakage current between the major surface of substrate 1 and film 16. Then, SIPOS having an oxygen concentration of about 20% and a nitrogen concentration of about 10% is deposited to a thickness of about 3,000 Å on the surface of substrate 1, through the reaction of $SiH_4$ and $N_2O$ at a temperature of, for example, 300° C., thus forming film 16.

Insulation film 13, having a thickness of about 1.0 μm and made of, for example, an undoped oxide, is formed on the entire major surface of substrate 1 including film 16.

Annealing (CAP anneal) is then performed. Specifically, after leaving the structure to stand in the entrance of an electric furnace for about 10 minutes, it is placed in an $N_2$ atmosphere in the furnace at a temperature of about 900° C. for about 30 minutes. Since annealing is performed while film 16 is covered or capped by film 13, and further, since HF dip was performed earlier, the surface recombination velocity of substrate 1 is reduced to 1,000 cm/sec or less, and the leakage current between substrate 1 and film 16 drops significantly.

Contact holes are then formed by a known method in film 13 to expose regions 3 and 4. Electrodes 8 and 9, made of, for example, aluminum, are formed by a known method to extend into the contact holes to contact regions 3 and 4, respectively.

High resistance film 12, serving as a passivation film, is then formed. Film 12 is made of amorphous $SiO_2$ which is obtained, for example, by a reaction of $SiH_4$ and $N_2O$ using a plasma CVD method or a low pressure CVD method. Film 12 may be made of amorphous Si obtained by the reaction of $SiH_4$ and $N_2$ using a plasma CVD method. Film 12 may also be made of amorphous SiC obtained by a reaction of $SiH_4$ and $C_3H_8$, using a plasma CVD method. The film may be made of SiN obtained by a reaction of $SiH_4$ and $NH_3$ using a plasma CVD method. In all of these cases, the amount of reactive gas is controlled to produce a film having a resistivity of $10^8$ to $10^{12}$ Ω·cm.

Figure 6:
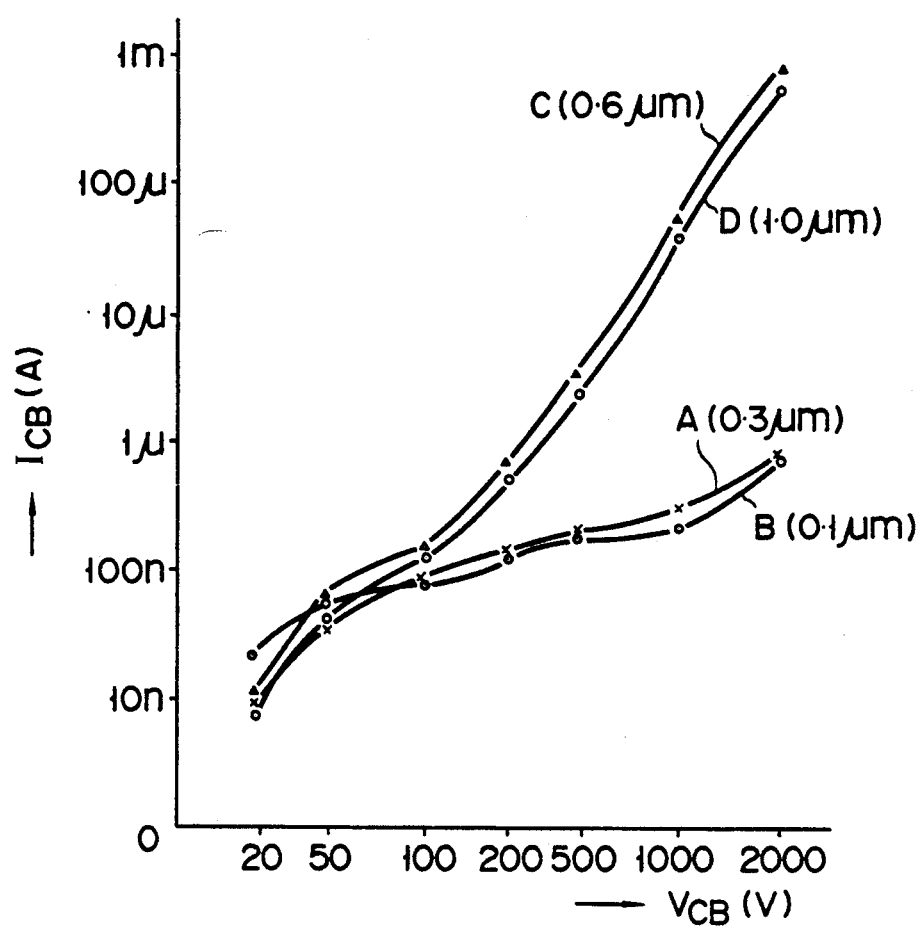
FIG. 6 is a graph showing the relationship between SIPOS film thickness and leakage current in the transistor shown in FIG. 5.

The power transistor shown in FIG. 5, with the guard-ring region and the SIPOS film set to a thickness of 3,000 Å, has a small leakage current over a wide VCB (collector-base voltage) range, as shown by characteristic curve A in FIG. 6. Even when voltage VCB reaches 2,000 V, breakdown does not occur. Curve B shows the case where the thickness of film 16 is set to 0.1 μm (100 Å). Curve B is very similar to curve A. Characteristic curves C and D are shown for the purpose of comparison with curves A and B. Curves C and D represent cases where the thickness of film 16 was set to 0.6 μm and 1.0 μm, respectively. As is evident from curves C and D, when the SIPOS film is made so thick, the leakage current increases as voltage VCB increases.

Furthermore, when the thickness of film 16 is reduced to below 100 Å, the shielding capabilities of film 16 against external voltages applied to passivation film 12 are reduced to almost nil. By applying a potential difference across film 12, through electrodes 8 and 9, and causing film 12 to conduct, however, it is possible to obtain a shield effect for substrate 1. Specifically, the external charge applied to film 12 flows in electrodes 8 and 9 through film 12, thus compensating for the shield effect for substrate 1.

In addition, the release capabilities of film 16 with respect to injected hot carriers are guaranteed over an acceptable range even when the thickness of film 16 is 3,000 Å or less.

Figure 7:
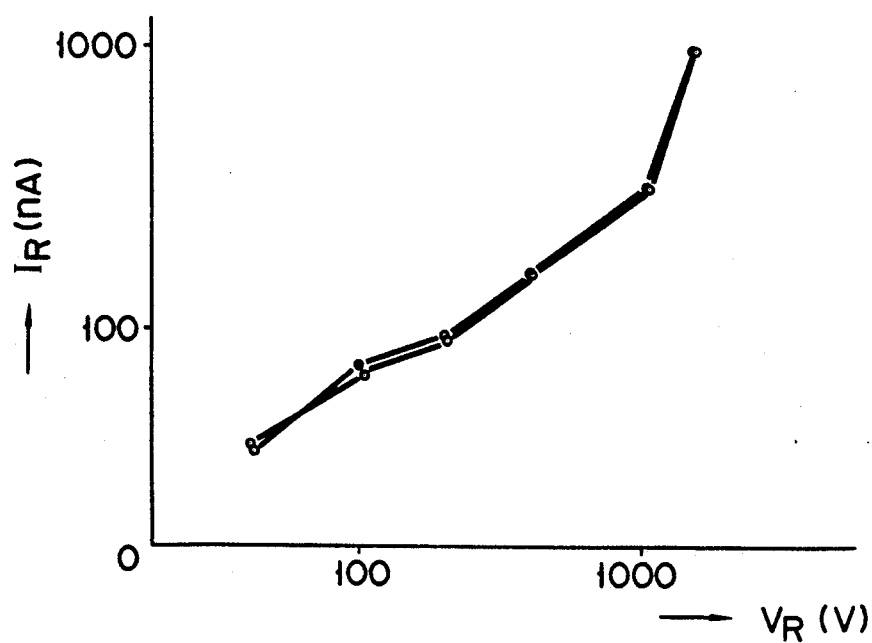
FIG. 7 is a graph showing the bias temperature stability of the transistor in FIG. 5 when the SIPOS film thickness is set at 0.3 μm.

FIG. 7 shows the results of a bias-temperature stress test for a transistor with a 3,000 Å-thick SIPOS film. Six samples were used in the test, and the graph in FIG. 7 shows the average value of the six samples. A bias voltage of 1,200 V was applied at a temperature of 125° C. The symbol · indicates an initial value, and ° indicates the value after 24 hours.

The test is also applied to the transistors with a SIPOS film of a thickness or 100 Å to 4,500 Å. The results are almost the same as that in the above-mentioned embodiment.

In a power transistor according to the present invention having a guard-ring region and a SIPOS film, the thickness of SIPOS film 16 is set between 100 Å and 4,500 Å, and a high resistance film 12 is formed as passivation film. With this structure, the reduction of the breakdown voltage by conductivity switching of film 16 can be prevented. A power transistor stable with regard to both external charges and hot carrier injection can be obtained, which offers a high reliability and high production yield.

By appropriately deciding the material, the deposition conditions, and annealing conditions for film 16, leakage current in the surface of substrate 1 can be reduced.

The embodiment in FIG. 5 shows an application of the present invention to a bipolar power transistor. However, the present invention can also be applied to a MOS power transistor. In this case, base region 3 becomes a source region, EQPR collector region 4 becomes an EQPR drain region, and the collector region becomes a drain region. Furthermore, though the transistor is of a planar structure in the FIG. 5 embodiment, the present invention can be applied to a transistor with a mesa structure.

Figure 8:
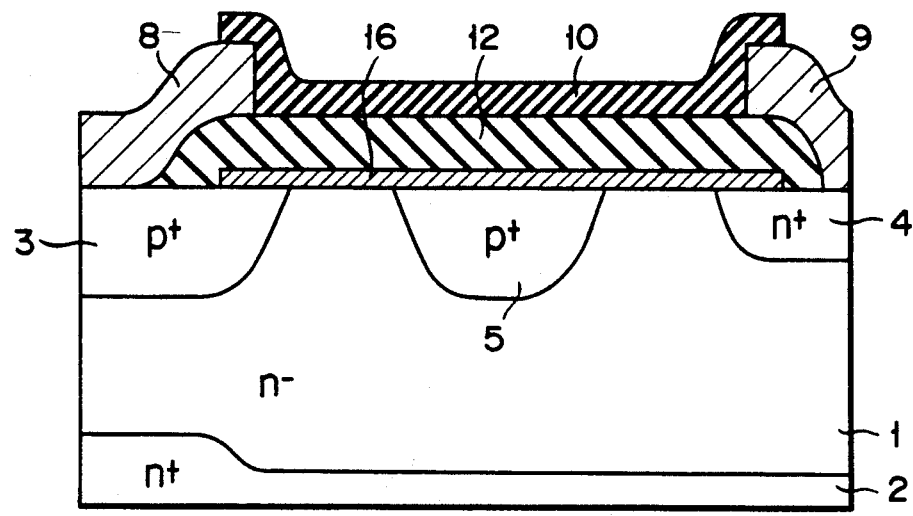
FIG. 8 is a sectional view of a portion of a power transistor according to another embodiment of the present invention which, has a guard-ring structure.

In the embodiment shown in FIG. 5, insulation film 13 is not necessarily required. It is possible to replace insulation film 13 with high resistance film 12. In this case, a passivation film similar to that in the conventional device of FIG. 1 may be used as shown in FIG. 8.

For the SIPOS film in the above mentioned embodiments, a polycrystalline silicon film containing at least one element selected from the group of carbon, oxygen, and nitrogen may be used.

Figure 9:
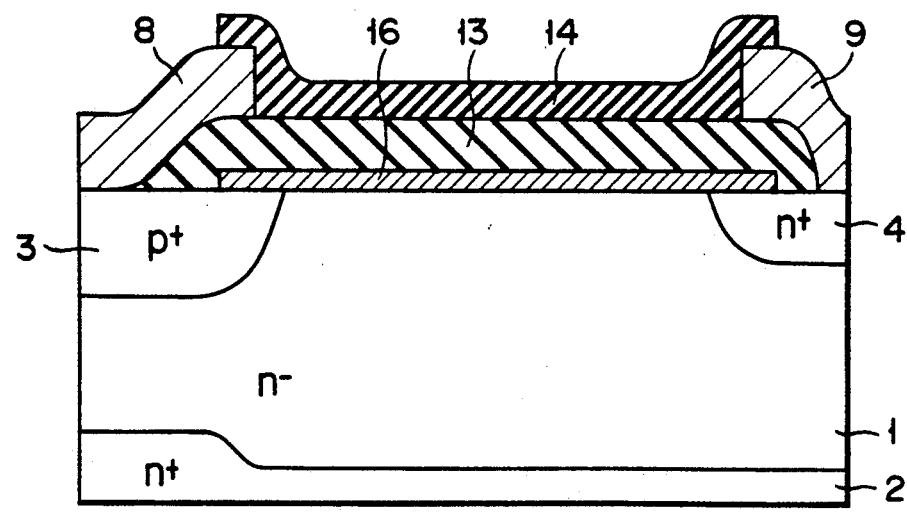
FIG. 9 is a sectional view of a portion of a power transistor according to still another embodiment of the present invention, which has a resistive field plate structure.

FIG. 9 shows another embodiment of the present invention. In this embodiment also, the present invention is applied to a power transistor, and the combination of a resistive field plate structure and a SIPOS film is used. The SIPOS film is made of polysilicon containing at least one of carbon, oxygen, and nitrogen.

Figure 2:
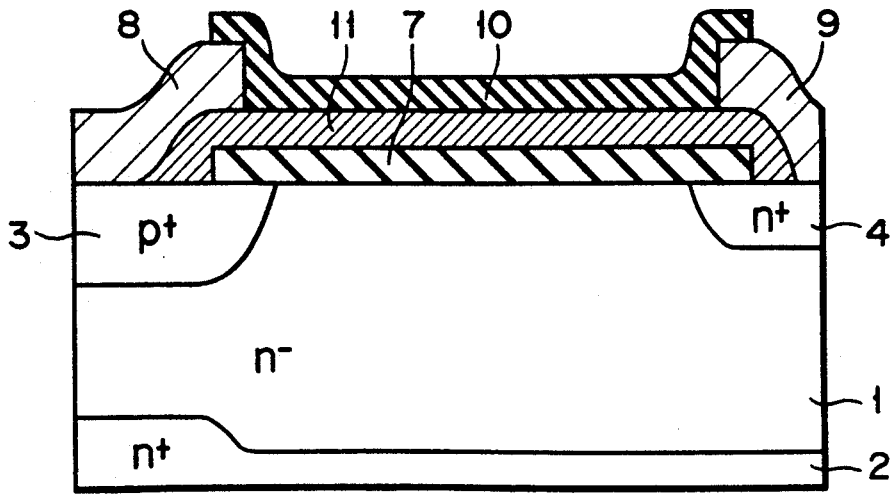
FIG. 2 is a cross-sectional view of a portion of another conventional power transistor.
Figure 3:
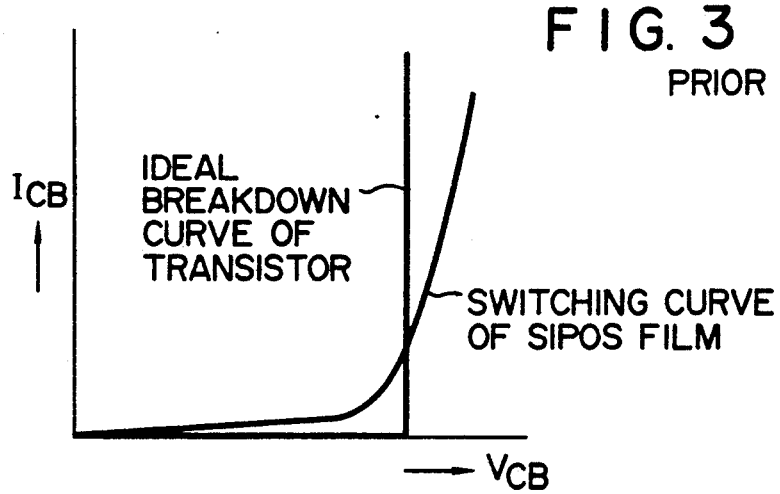
FIG. 3 is a graph showing the switching curve of the SIPOS film and an ideal breakdown curve of the power transistor shown in FIG. 1.
Figure 4:
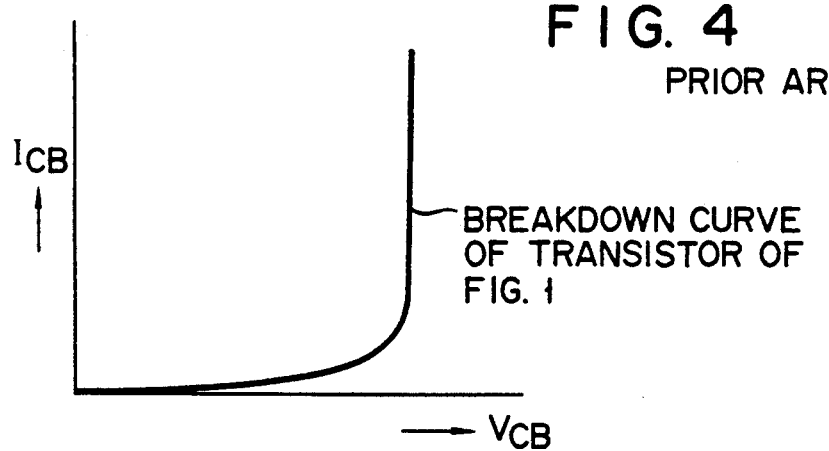
FIG. 4 is a graph showing the breakdown characteristics of the power transistor shown in FIG. 1.

This embodiment differs from the conventional device of FIG. 2 in the following respects:

First, SIPOS film 16 having a thickness of about 3000 Å+1500 Å is formed directly on silicon substrate 1.

Second, insulation film 13 is formed on SIPOS film 16 to fully cover the SIPOS film. Insulation film 13 contacts at both ends, base region 3 and EQPR collector ring region 4. As a field plate, polysilicon film 14 containing at least one of carbon, oxygen, and nitrogen is formed on SIPOS film. Polysilicon film 14 contacts, at both ends, electrodes 8 and 9. Polysilicon film 14 also contacts, at both ends, regions 3 and 4. Other portions of the transistor shown in FIG. 9 are substantially the same as those in the transistor shown in FIG. 2; thus a detailed description thereof will be omitted.

Some steps in the manufacture of the transistor in FIG. 8 will now be described.

Film 16 is formed by, for example, a plasma CVD method. Before this processing, dilute hydrofluoric acid is used to perform HF dip on the major surface of substrate 1, in order to minimize the leakage current between the major surface of substrate 1 and film 16. Then, SIPOS having an oxygen concentration of about 20% and a nitrogen concentration of about 10% is deposited to a thickness of about 3,000 Å±1500 Å on the surface of substrate 1, through the reaction of $SiH_4$ and $N_2O$ at a temperature of, for example, 300° C., thus forming film 16.

Thereafter, insulation film 13, undoped with oxygen, for example, is formed on SIPOS film 16 to fully cover the SIPOS film.

Thereafter, contact holes are formed by a known method in film 13, to expose regions 3 and 4. Electrodes 8 and 9, made of, for example, aluminum, are formed by a known method to extend into the contact holes, to contact regions 3 and 4, respectively.

Here, field plate 14 is formed. Plate 14 is made of amorphous $SiO_2$ which is obtained, for example, by a reaction of $SiH_4$ and $N_2O$ using a plasma CVD method or a low pressure CVD method. Plate 14 may alternatively be made of amorphous Si obtained by a reaction of $SiH_4$ and $N_2$ using a plasma CVD method. Plate 14 may also be made of amorphous SiC obtained by a reaction of $SiH_4$ and $C_3H_8$ using a plasma CVD method. The plate may be made of SiN obtained by a reaction of $SiH_4$ and $NH_3$ using a plasma CVD method. In all of these cases, the amount of reactive gas is controlled to produce a plate having a resistivity of $10^7$ to $10^{10}$ Ω·cm.

It is found that, even when the thickness of the SIPOS film is between 100 Å to 4500 Å, SIPOS film does not have the ability to shield against the potential gradation on field plate 14. Therefore, the electric field on the surface of the substrate is not prevented from being released.

With the power transistor shown in FIG. 8 in which the SIPOS film has the thickness of 100 Å to 4500 Å, a stable passivation structure can be realized without losing the effect provided by the potential gradation, thus enhancing the reliability and the production yield of the device.

As is clear from the above, according to the present invention, there is provided a semiconductor device with a high breakdown voltage, an enhanced reliability, and a high manufacturing yield.

What is claimed is:

1. A semiconductor device with a high breakdown voltage comprising:

a semiconductor substrate having a PN junction, said PN junction being exposed on a major surface of said semiconductor substrate;

a semi-insulative polysilicon film formed on said major surface, said polysilicon film covering said PN junction, said polysilicon film containing at least one of carbon, oxygen and nitrogen, and said polysilicon film having a thickness from substantially 100 Å to substantially 4500 Å;

a semiconductor region, as a guard-ring, formed in said semiconductor substrate;

an insulation film formed on said polysilicon film, said insulation film covering said polysilicon film and provided with contact holes;

electrodes extending through said contact holes and contacting said semiconductor substrate; and a high resistance insulation film, having a resistivity from substantially $10^8$ to substantially $10^{12}$ Ω-cm, formed on said insulation film, said high resistance insulation film covering said insulation film and ending adjacent to and in contact with said electrodes.

2. A semiconductor device with a high breakdown voltage comprising:

a semiconductor substrate having a PN junction, said PN junction being exposed on the major surface of said semiconductor substrate;

a semi-insulative polysilicon film formed on said major surface, said polysilicon film covering said PN junction, said polysilicon film containing at least one of carbon, oxygen, and nitrogen, and said polysilicon film having a thickness from substantially 100 Å to substantially 4500 Å;

an insulation film formed on said polysilicon film, said insulation film covering said polysilicon film and provided with contact holes;

electrodes extending through said contact holes and contacting said semiconductor substrate; and a resistive field plate formed on said insulation film, said resistive field plate covering said insulation film and ending adjacent to and in contact with said electrodes.

3. A semiconductor device according to claim 2, in which said resistive field plate is constituted of a polysilicon film containing at least one of carbon, oxygen, and nitrogen.

* * * * *